United States Patent [19]
Hartner et al.

[11] Patent Number: 6,097,050
[45] Date of Patent: Aug. 1, 2000

[54] MEMORY CONFIGURATION WITH SELF-ALIGNING NON-INTEGRATED CAPACITOR CONFIGURATION

[75] Inventors: Walter Hartner; Günther Schindler, both of München; Carlos Mazure-Espejo, Zorneding, all of Germany

[73] Assignee: Siemens Aktiengesellschaft, Munich, Germany

[21] Appl. No.: 09/282,041

[22] Filed: Mar. 30, 1999

Related U.S. Application Data

[63] Continuation of application No. PCT/DE97/01664, Aug. 7, 1997.

[30] Foreign Application Priority Data

Sep. 30, 1996 [DE] Germany .................. 196 40 213

[51] Int. Cl.$^7$ .................. H01L 29/72
[52] U.S. Cl. .................. 257/296; 257/303; 257/306; 257/532; 257/618; 257/773; 257/778
[58] Field of Search .................. 257/296, 303, 257/306, 532, 618, 773, 778

[56] References Cited

U.S. PATENT DOCUMENTS 5,060,191 10/1991 Nagasaki et al. .
5,335,138 8/1994 Sandhu et al. .................. 257/295

FOREIGN PATENT DOCUMENTS 0 358 867 A1 3/1990 European Pat. Off. .
0 700 088 A2 3/1996 European Pat. Off. .

OTHER PUBLICATIONS

International Publication No. WO 89/02653 (Go), dated Mar. 23, 1989.

International Publication No. WO 94/08442 (Pepe et al.), dated Apr. 14, 1994.

Primary Examiner—Edward Wojciechowicz
Attorney, Agent, or Firm—Herbert L. Lerner; Laurence A. Greenberg; Werner H. Stemer

[57] ABSTRACT

A memory configuration with a self-aligning non-integrated capacitor configuration includes a capacitor configuration and a transistor configuration which can be joined together in a self-aligning manner in such a way that each first contact of a transistor of the transistor configuration is connected to a respective second contact of a memory capacitor of the capacitor configuration. In order to align the two configurations, the second contacts are constructed in a protruding manner, and when joining takes place they engage in a structure including elevations.

24 Claims, 4 Drawing Sheets

MEMORY CONFIGURATION WITH SELF-ALIGNING NON-INTEGRATED CAPACITOR CONFIGURATION

CROSS-REFERENCE TO RELATED APPLICATION

This application is a continuation of copending International Application No. PCT/DE97/01664, filed Aug. 7, 1997, which designated the United States.

BACKGROUND OF THE INVENTION

Field of the Invention

The invention relates to a memory configuration which has the following features:

a transistor configuration having a multiplicity of transistors which are each connected to a first contact;

a capacitor configuration with a multiplicity of capacitors each having a first electrode and a second electrode, between which a memory dielectric is located, and a second contact of the first electrode;

the transistor configuration and the capacitor configuration are joined in such a way that a first main surface of the transistor configuration and a second main surface of the capacitor configuration are disposed opposite one another, and each first contact is connected to a respective second contact; and the second contacts protrude from the second main surface.

Such memory configurations in which the transistor configuration and the capacitor configuration are manufactured separately from one another and then joined, are mainly used when ferroelectric substances are to be used as memory dielectrics. That is because a large number of the ferroelectric substances which are suitable as memory dielectrics can only be involved with difficulty in the manufacturing process in which the transistor configuration is manufactured.

A known memory configuration in which the transistor configuration and capacitor configuration are manufactured separately from one another is configured in such a way that both the first contacts of the transistor configuration and the second contacts of the capacitor configuration are constructed in a protruding manner before the transistor configuration and capacitor configuration are joined. When transistor configurations and capacitor configurations which are configured in such a way are joined, it is necessary to ensure that each first contact is connected to a respective second contact, the two contacts are fused to one another in a short tempering step and a permanent conductive connection is produced.

An inspection to determine whether or not first contacts and second contacts are connected to one another before the tempering step, can only be carried out indirectly with such memory configurations, for example through the use of marks at the edges of the configurations. Since that method entails a number of inaccuracies, it is necessary, under certain circumstances, to implement the contact surfaces of the first and second contacts with larger surfaces than would be necessary for a conductive connection.

SUMMARY OF THE INVENTION

It is accordingly an object of the invention to provide a memory configuration with a self-aligning non-integrated capacitor configuration, which overcomes the hereinaforementioned disadvantages of the heretofore-known devices of this general type in such a way that when a transistor configuration and a capacitor configuration are joined, a connection of a respective first contact to a respective second contact can be ensured in a simple way so that, in particular, the alignment problems mentioned above no longer occur.

With the objects of the invention in view there is also provided a memory configuration, comprising a first substrate having a transistor configuration with a first main surface and a multiplicity of transistors; first contacts each connected to a respective one of the transistors and reaching the first main surface; a multiplicity of elevations of electrically insulating material emerging from the first main surface; a capacitor configuration including a second main surface and a multiplicity of capacitors each having a first electrode, a second electrode and a memory dielectric between the first and second electrodes; second contacts each electrically connected to a respective one of the first electrodes and emerging from the second main surface; the first main surface of the transistor configuration and the second main surface of the capacitor configuration disposed opposite one another, wherein only the second contacts and the elevations are disposed between the first main surface and the second main surface; each of the first contacts is electrically connected to a respective one of the second contacts; and the second contacts protrude and engage between the elevations.

In the memory configuration described, it is possible to align the transistor configuration and the capacitor configuration during the joining operation in a simple manner, in such a way that each first contact comes to rest over a respective second contact, so that the two contacts can be conductively connected to one another in a tempering step, and so that each one of the transistors is connected in an electrically conductive manner to a respective one of the capacitors. The alignment of the two configurations is made by the engagement of the second contacts that are constructed in a protruding manner, between the elevations formed between the first contacts. The alignment takes place directly and does not need marks at the edges of the transistor configuration and the capacitor configuration. Due to the more exact alignment possibility which is enabled by the described memory configuration, it is possible to give the protruding contacts smaller dimensions than in the case of previously known memory configurations of this type and, nevertheless, to ensure that sufficient contact is established between the first contact and the second contact.

In the previous description, it was assumed that the second contacts of the capacitor configuration in the second main surface are constructed in a protruding manner, and that, when the transistor configuration and the capacitor configuration are joined, the second contacts engage between elevations which are disposed between the first contacts in the first main surface of the transistor configuration. However, the protruding structure of the second contacts on the capacitor configuration and the presence of a corresponding structure including elevations on the transistor configuration is of significance only for the establishment of contact between transistors of the transistor configuration and capacitors of the capacitor configuration. Therefore, it is clear that the first contacts of the transistor configuration can also be constructed in a protruding manner and the structure including elevations can be attached to the capacitor configuration. In this way, during the joining procedure, the protruding first contacts of the transistor configuration engage between the elevations in the capacitor configuration which are formed between the second contacts.

With the objects of the invention in view there is also provided a memory configuration, comprising a first substrate having a transistor configuration with a first main surface and a multiplicity of transistors; first contacts each connected to a respective one of the transistors and protruding from the first main surface; a second substrate having a capacitor configuration with a second main surface and a multiplicity of capacitors each having a first electrode, a second electrode and a memory dielectric between the first and second electrodes; the first electrodes projecting to the second main surface; a multiplicity of elevations of electrically insulating material emerging from the second main surface between the first electrodes; the first main surface of the transistor configuration and the second main surface of the capacitor configuration disposed opposite one another, wherein only the first contacts and the elevations are disposed between the first main surface and the second main surface; each of the first contacts is connected to a respective one of the first electrodes; and the first contacts protrude and engage between the elevations.

The embodiments described below apply both to second contacts which are constructed in a protruding manner and have a structure which is disposed on the transistor configuration and includes elevations, as well as to first contacts which are constructed in a protruding manner and have a structure which is disposed on the capacitor configuration and includes elevations. Since the following embodiments always relate to both of the embodiments mentioned already, the term "protruding contact" is used below synonymously, with a second contact which is constructed in a protruding manner, wherein it is assumed that the structure including elevations is located on the transistor configuration, and with a first contact which is constructed in a protruding manner, wherein it is assumed that the structure including elevations is located on the capacitor configuration. Likewise, the term "corresponding contact" is used synonymously with the first contact, wherein the second contact is constructed in a protruding manner, and with the second contact, in which case the first contact is constructed in a protruding manner.

In accordance with another feature of the invention, the structure including the elevations is composed of an insulating layer which has cut-outs. The cut-outs are dimensioned in such a way that the protruding contacts can engage between them and can be connected to the corresponding contact, which is located in the region of the cut-outs. Preferably, the edges which are produced on the insulating layer at the edges of the cut-outs are rounded off in order to ensure that the protruding contacts can engage more easily in the cut-outs.

In accordance with a further feature of the invention, the cut-outs have a rectangular, preferably square, structure, while a further embodiment provides for the cut-outs to have a circular structure.

In accordance with an added feature of the invention, the structure including the elevations are formed from annular elevations which are disposed next to one another. With such a structure, every second corresponding contact is located within one of the annular elevations, while the respective other corresponding contact is surrounded by a number of annular elevations, preferably four. In order to ensure simple engagement of the protruding contacts between the annular elevations, the annular elevations preferably have a hemispherical, in particular semicircular, cross-section.

Since the protruding contacts can bear on the structure including the elevations after the joining of the capacitor configuration and the transistor configuration, it is necessary to prevent a situation where two contacts can be connected conductively by the elevations. Therefore, in accordance with an additional feature of the invention, the structure including the elevations is composed of an electrically insulating material. One embodiment of the invention provides for the structure to be formed from elevations made of glass.

In accordance with yet another feature of the invention, the memory configuration is applied in particular when ferroelectrics are used as memory dielectrics. One embodiment of the invention provides for a ferroelectric to be used as a memory dielectric in the capacitors of the capacitor configuration.

In accordance with yet a further feature of the invention, suitable materials of this type are, for example, oxidic dielectrics, such as PZT $(Pb, Zr)TiO_3$, BST $(Ba, Sr)TiO_3$, ST $SrTiO_3$ or SBTN $SrBi_2, (Ta_{1-x}, Nb_x)_2O_9$, wherein the formulae $(Pb, Zr)TiO_3$ and $(Ba, Sr)TiO_3$ represents $Pb_xZr_{1-x}TiO_3$ and $Ba_xSr_{1-x}TiO_3$ respectively.

In accordance with a concomitant feature of the invention, oxidic dielectrics of this type are be used as memory dielectrics. Since the ferroelectric properties of such substances are temperature-dependent and the aforesaid materials have para-electric properties above a specific temperature, there is also a provision for a memory dielectric with para-electric properties to be used, wherein the dielectric constant is greater than 10 and preferably greater than 100.

Other features which are considered as characteristic for the invention are set forth in the appended claims.

Although the invention is illustrated and described herein as embodied in a memory configuration with a self-aligning non-integrated capacitor configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
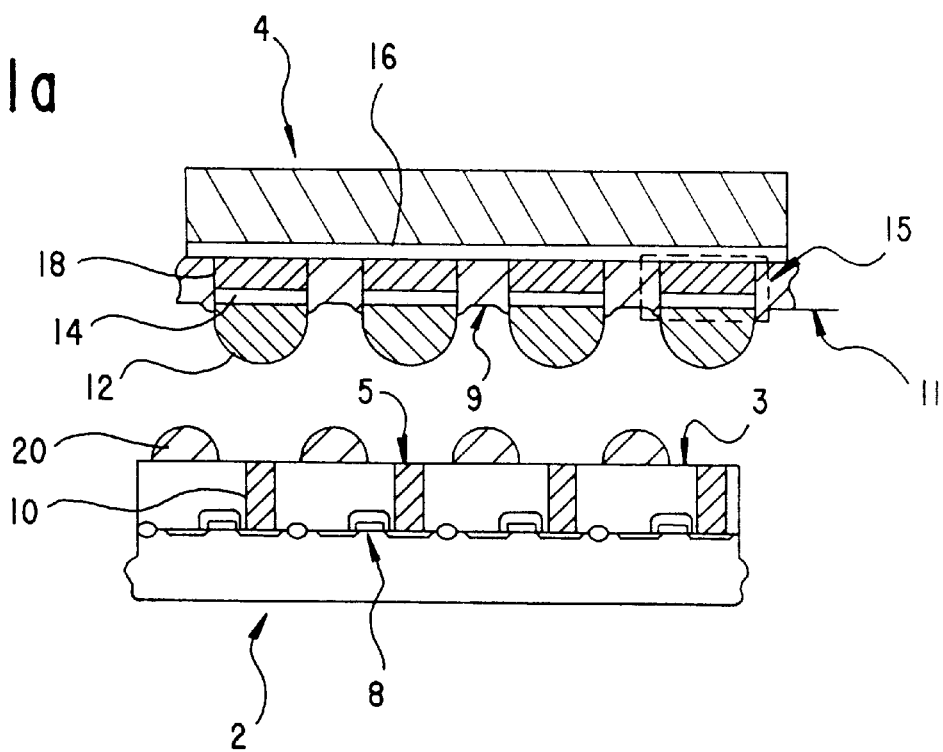
FIGS. 1*a* and 1*b* are diagrammatic, cross-sectional views of a first exemplary embodiment of a memory configuration according to the invention.
Figure 1B:
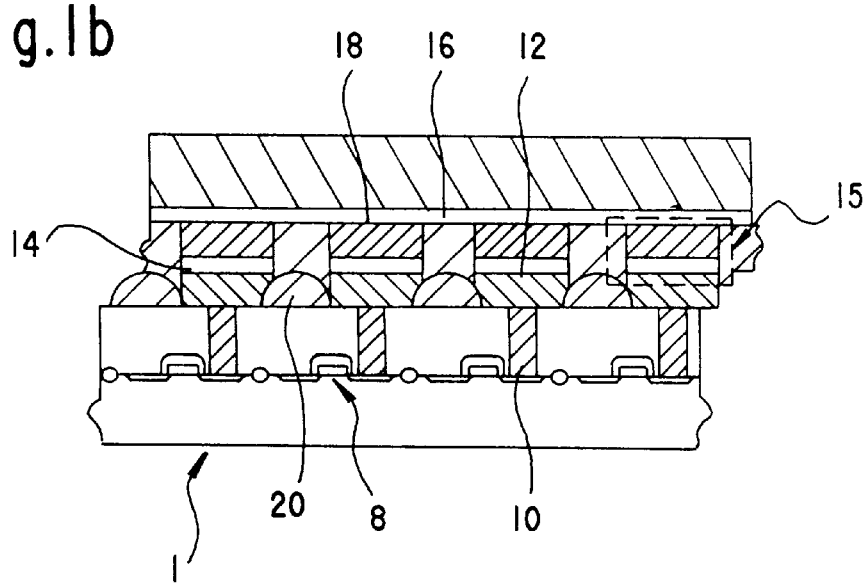

Referring now in detail to the figures of the drawings, in which unless otherwise stated, identical reference symbols designate identical components with the same meaning, and first, particularly, to FIGS. 1a and 1b thereof, there is seen a first exemplary embodiment of a memory configuration 1 according to the invention in cross-section. FIG. 1a illustrates a first substrate having a transistor configuration 2, and a capacitor configuration 4, before being joined together, whereas FIG. 1b illustrates the transistor configuration 2 and the capacitor configuration 4 joined to form the memory configuration 1. As is clear from FIGS. 1a and 1b, the transistor configuration 2 has a multiplicity of transistors 8, each having a first contact 10. A first contact surface 5 of each first contact 10 is disposed in a first main surface 3 of the transistor configuration 2. In addition, in the first main surface 3 of the transistor configuration 2 there is a structure including elevations 20. In the present exemplary embodiment, the elevations 20 have a semi-circular cross-section between the first contact surfaces 5.

The capacitor configuration 4 has a multiplicity of capacitors 15 each having a first electrode 14, a memory dielectric 18 and a second electrode 16. The second electrode 16 is shared by a number of capacitors 15 in the present exemplary embodiment. The first electrode 14 has a second contact 12 which is constructed in a protruding manner in the form of a bump in the present exemplary embodiment.

As is clear from FIG. 1b, after the transistor configuration 2 and the capacitor configuration 4 have been joined, the second contacts 12, which are constructed in a protruding manner, engage in the structure including the elevations 20. In each case, a respective second contact 12 is conductively connected to a respective first contact 10. As is clear from FIG. 1b, the second contacts 12, which are originally constructed in a protruding manner, are deformed by a tempering step, which is necessary in order to fuse the first contacts 10 and the second contacts 12 to one another.

It is desirable to prevent conductive material, of which the second contacts 12 are composed, from being pressed in the direction of adjacent contacts during the tempering step and thus establishing a conductive connection between two adjacent contacts. In order to do so, in the present exemplary embodiment depressions 9 are provided in a second main surface 11 of the capacitor configuration 4. The structure including the elevations 20 of the transistor configuration 2 engages into the depressions 9, causing two adjacent second contacts 12 to be reliably separated from one another.

Figure 2A:
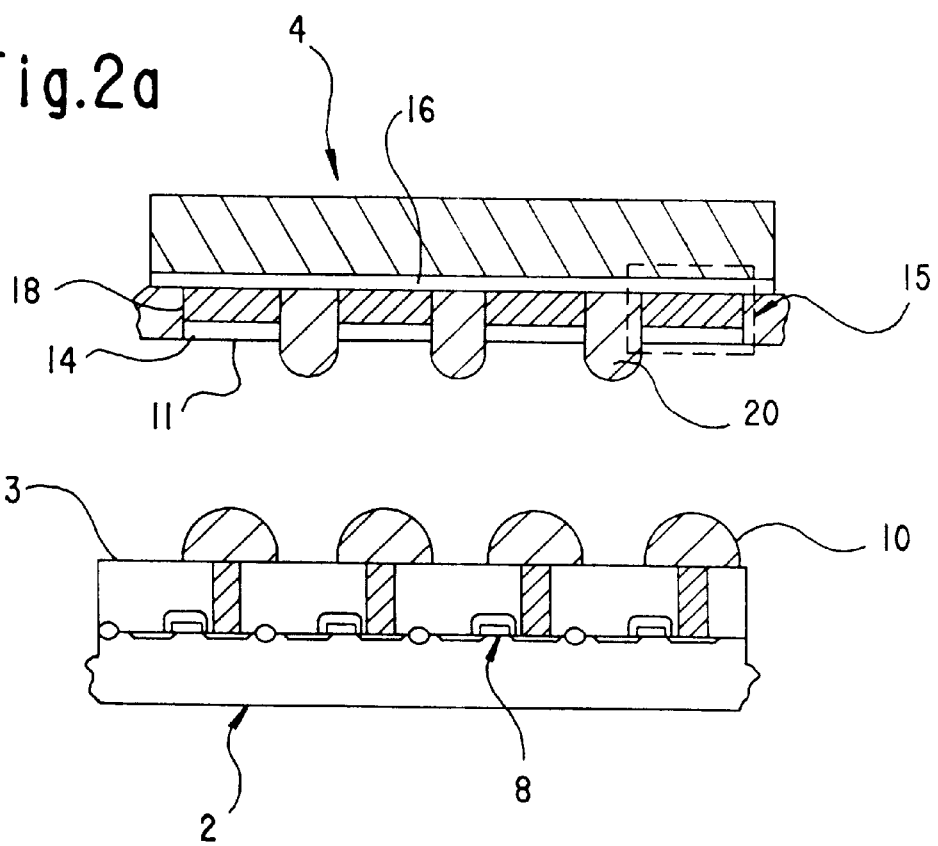
FIGS. 2*a* and 2*b* are cross-sectional views of a second exemplary embodiment of a memory configuration according to the invention.
Figure 2B:
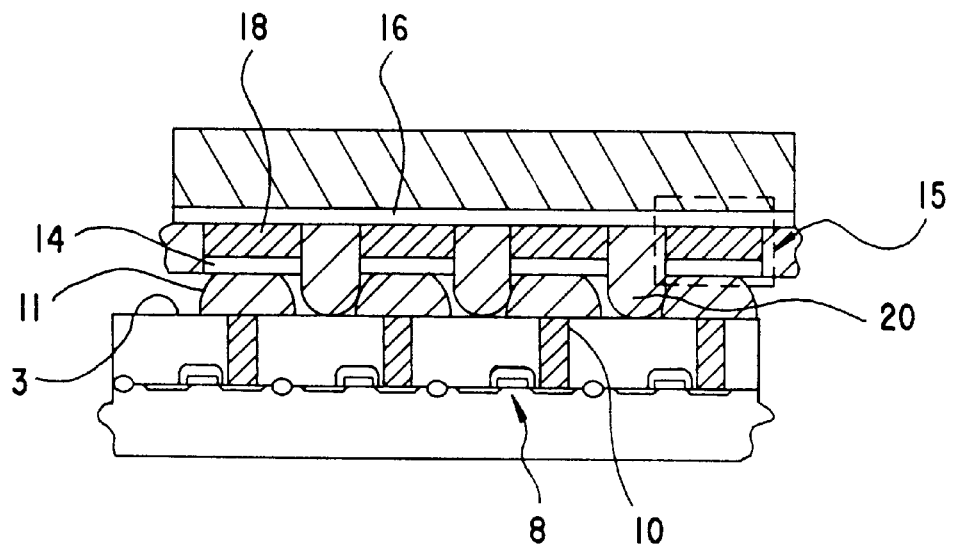

FIGS. 2a and 2b illustrate a second exemplary embodiment of a memory configuration according to the invention. FIG. 2a illustrates a first substrate having a transistor configuration 2 and a second substrate having a capacitor configuration 4 before they are joined, whereas FIG. 2b illustrates the transistor configuration 2 and the capacitor configuration 4 joined to form a memory configuration 1. In the illustrated exemplary embodiment, the first contacts 10 of the transistor configuration 2 are constructed in a protruding manner, and the capacitor configuration 4 has a structure including elevations 20. First electrodes 14 of memory capacitors 15 are disposed between the structure including the elevations 20. The second electrode 12, which is described in FIG. 1 and is constructed there in a protruding manner, is omitted in the present exemplary embodiment. In this case, the first electrode 14 of the memory capacitor 15 forms both the first electrode 14 and the second contact.

FIG. 2b illustrates the transistor configuration 2 and the capacitor configuration 4 joined to form the memory configuration 1. After the joining operation, the first contacts 10, which are constructed in a protruding manner, are connected to the first electrode 14 of the memory capacitor 15 and are slightly deformed by the tempering step during the joining operation.

Figure 3A:
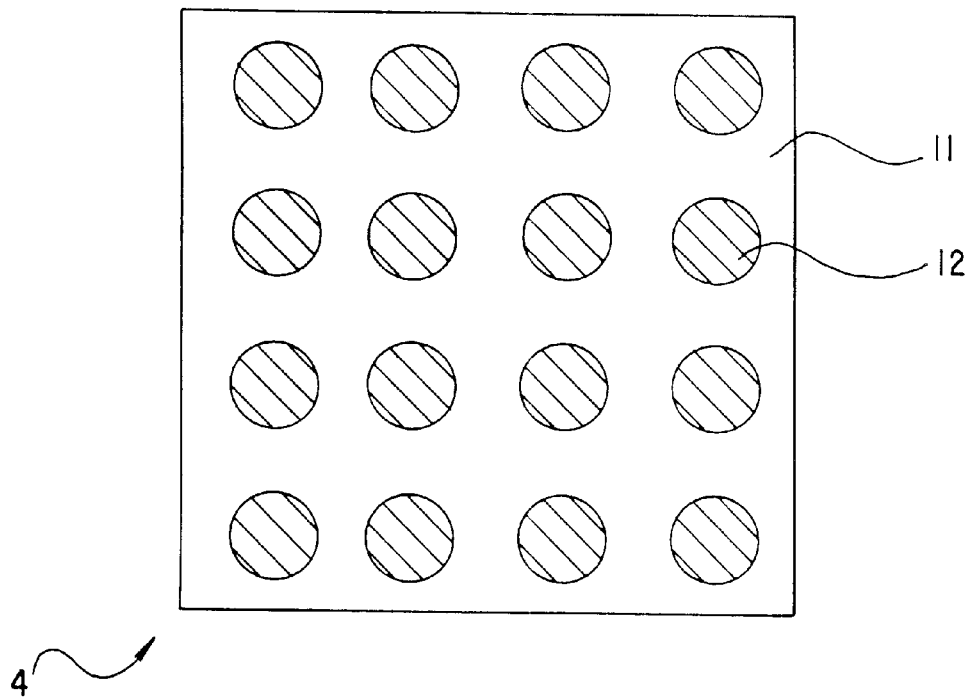
FIGS. 3*a* and 3*b* are plan views of a transistor configuration and a capacitor configuration according to a further exemplary embodiment of a memory configuration according to the invention.
Figure 3B:
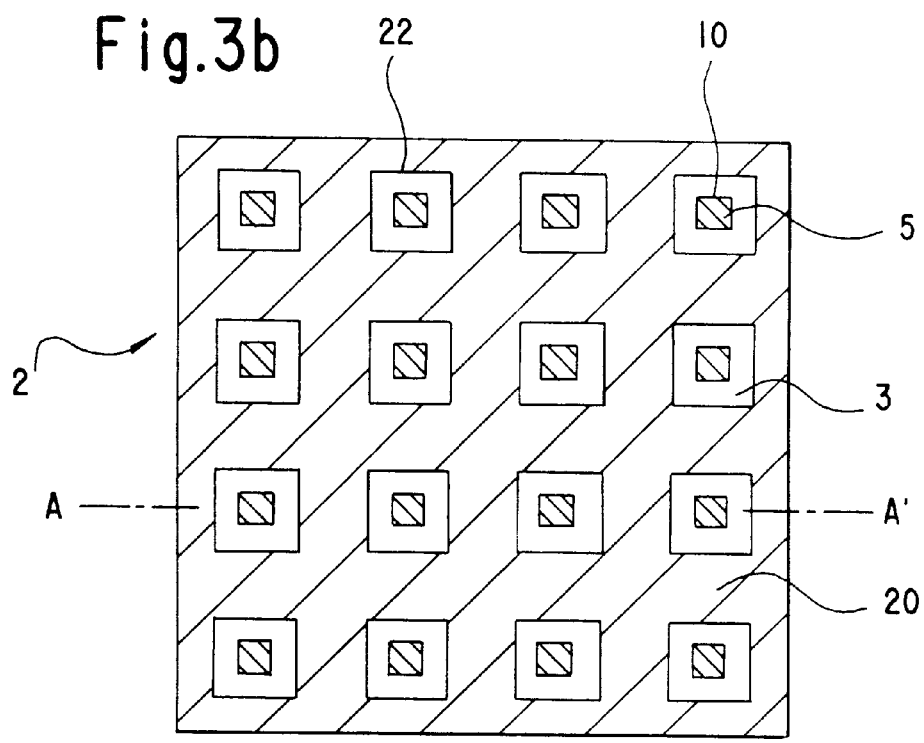

FIGS. 3a and 3b illustrate an embodiment of the memory configuration according to the invention in a plan view of a capacitor configuration 4 and a transistor configuration 2. The capacitor configuration 4 which is illustrated in a plan view has second contacts 12 which are constructed in a protruding manner and which are located in a second main surface 11 of the capacitor configuration 4. The illustrated capacitor configuration 4 corresponds to the capacitor configuration 4 illustrated in cross-section in FIG. 1a.

The transistor configuration illustrated in FIG. 3b has a number of first contacts 10 with first contact surfaces 5 which are disposed in a first main surface 3 of the transistor configuration 2. In the illustrated exemplary embodiment, a structure which is located on the transistor configuration 2 and includes elevations is composed of an insulation layer which has rectangular cut-outs 22. The first contact surfaces 5 are disposed in the cut-outs 22. If edges which are produced at a boundary of the cut-outs to the insulation layer are rounded off, a section along a line A–A' shown in FIG. 3b yields the cross-section illustrated in FIG. 1a.

Figure 4:
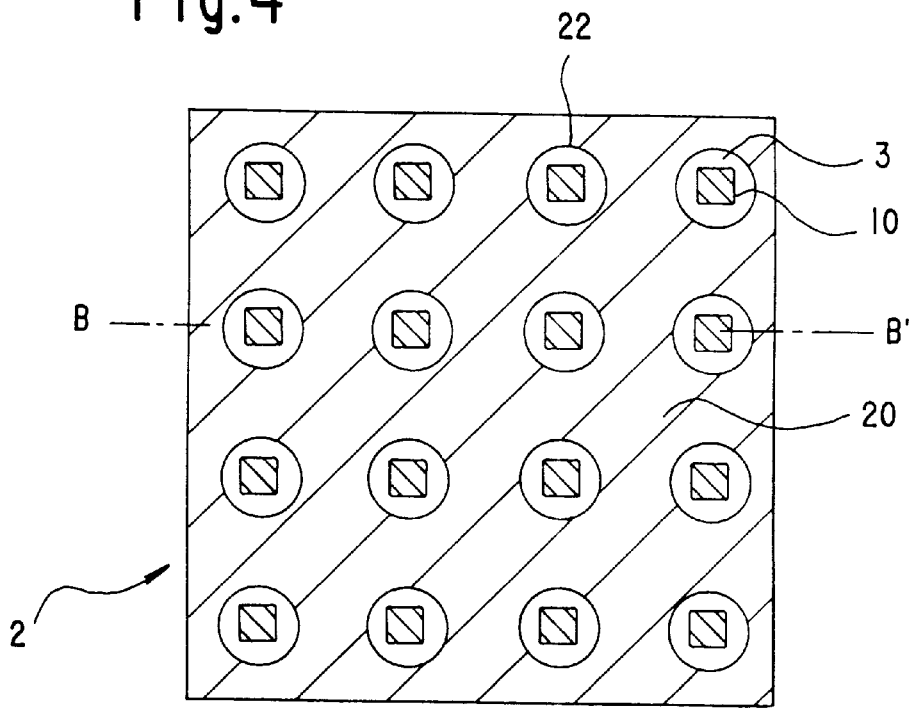
FIG. 4 is a plan view of an exemplary embodiment of a transistor configuration.

A further embodiment of a transistor configuration which has a structure including elevations 20 is illustrated in FIG. 4. The structure including the elevations 20 is in turn composed of an insulation layer which has cut-outs 22. The cut-outs 22 have a circular structure in the present exemplary embodiment. The first contact surfaces 5 of the first contacts are located inside the cut-outs 22 of the insulation layer. If the edges of the insulation layer which are produced at the boundaries of the cut-outs 22 are rounded off, a section along a line B–B' illustrated in FIG. 4 yields the cross-section illustrated in FIG. 1a for the transistor configuration 2. Rounding off the edges is appropriate, in order to make it easier for the second contacts 12 which are constructed in a protruding manner to slide into the cut-outs 22.

Figure 5:
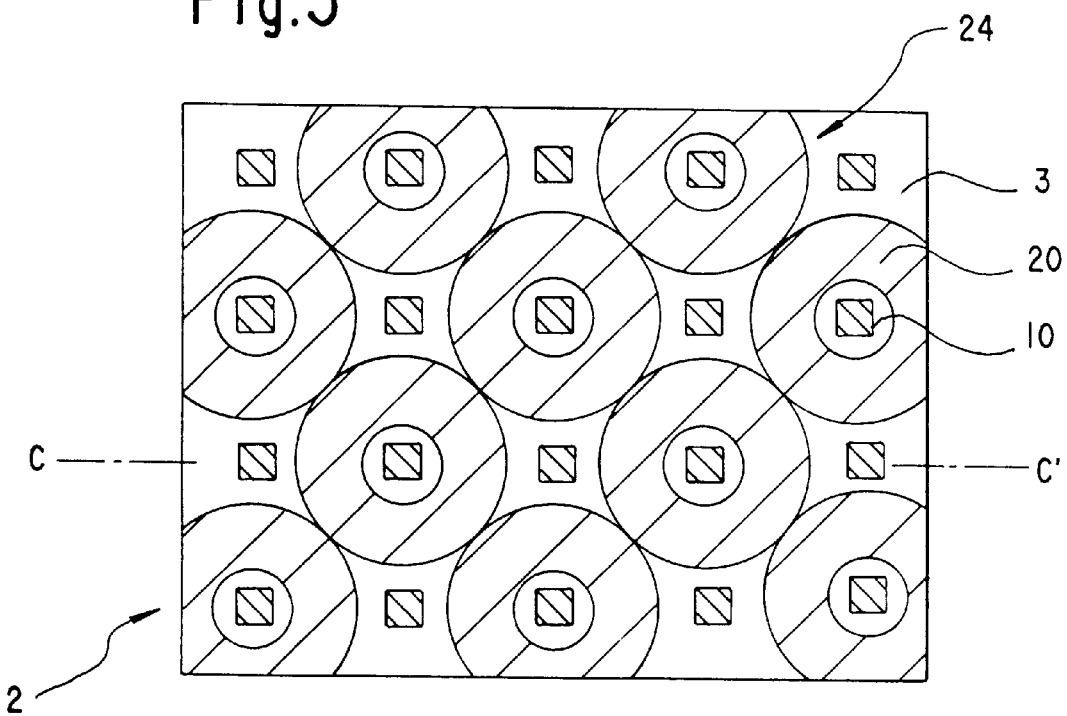
FIG. 5 is a plan view of a further exemplary embodiment of a transistor configuration.

A further exemplary embodiment of a transistor configuration is illustrated in a plan view in FIG. 5. In the present exemplary embodiment, a structure including elevations 20 is composed of a number of annular elevations which are disposed next to one another. Every second first contact surface 5 of a first contact 10 is located inside one of the annular elevations, while the other first contact surfaces 5 are surrounded by four annular elevations 24 in each case. Given a structure of the annular elevations 24 with a hemispherical, preferably semi-circular cross-section, a section along a line C–C' shown in FIG. 5 yields the transistor configuration illustrated in cross-section in FIG. 1a.

It is to be noted that the structures including the elevations illustrated in FIGS. 3b, 4 and 5 do not necessarily have to be disposed on the transistor configuration. Instead, they can also be disposed on the capacitor configuration if the first contact of the transistor configuration is constructed in a protruding manner. Likewise, given a protruding structure of the first contact or of the second contact, it is not necessary to make a contact surface of the respective other contact planar. Instead, the contact surface which is located between the structure including the elevations can also be constructed in a protruding manner, provided the height of the contact surface dies not exceed the elevations of the structure including the elevations.

We claim:

1. A memory configuration, comprising:
   a) a first substrate having a transistor configuration with a first main surface and a multiplicity of transistors;
   b) first contacts each connected to a respective one of said transistors and reaching said first main surface;
   c) a multiplicity of elevations of electrically insulating material emerging from said first main surface;

d) a capacitor configuration including a second main surface and a multiplicity of capacitors each having a first electrode, a second electrode and a memory dielectric between said first and second electrodes;
e) second contacts each electrically connected to a respective one of said first electrodes and emerging from said second main surface;
f) said first main surface of said transistor configuration and said second main surface of said capacitor configuration disposed opposite one another, wherein:
   fa) only said second contacts and said elevations disposed between said first main surface and said second main surface;
   fb) each of said first contacts electrically connected to a respective one of said second contacts; and
   fc) said second contacts protruding and engaging between said elevations.

2. A memory configuration, comprising:
a) a first substrate having a transistor configuration with a first main surface and a multiplicity of transistors;
b) first contacts each connected to a respective one of said transistors and protruding from said first main surface;
c) a second substrate having a capacitor configuration with a second main surface and a multiplicity of capacitors each having a first electrode, a second electrode and a memory dielectric between said first and second electrodes;
d) said first electrodes projecting to said second main surface;
e) a multiplicity of elevations of electrically insulating material emerging from said second main surface between said first electrodes;
f) said first main surface of said transistor configuration and said second main surface of said capacitor configuration disposed opposite one another, wherein:
   fa) only said first contacts and said elevations disposed between said first main surface and said second main surface;
   fb) each of said first contacts connected to a respective one of said first electrodes; and
   fc) said first contacts protruding and engaging between said elevations.

3. The memory configuration according to claim 1, including a structure having said elevations and formed of an insulating layer with cutouts.

4. The memory configuration according to claim 2, including a structure having said elevations and formed of an insulating layer with cutouts.

5. The memory configuration according to claim 1, wherein said cutouts are circular.

6. The memory configuration according to claim 2, wherein said cutouts are circular.

7. The memory configuration according to claim 1, wherein said cutouts are rectangular.

8. The memory configuration according to claim 2, wherein said cutouts are rectangular.

9. The memory configuration according to claim 1, wherein said cutouts are square.

10. The memory configuration according to claim 2, wherein said cutouts are square.

11. The memory configuration according to claim 1, including a structure having said elevations and formed of annular elevations disposed next to one another.

12. The memory configuration according to claim 2, including a structure having said elevations and formed of annular elevations disposed next to one another.

13. The memory configuration according to claim 1, including a structure having said elevations and formed of insulation material.

14. The memory configuration according to claim 2, including a structure having said elevations and formed of insulation material.

15. The memory configuration according to claim 13, wherein said insulation material is glass.

16. The memory configuration according to claim 14, wherein said insulation material is glass.

17. The memory configuration according to claim 1, wherein said memory dielectric is a ferroelectric.

18. The memory configuration according to claim 2, wherein said memory dielectric is a ferroelectric.

19. The memory configuration according to claim 1, wherein said memory dielectric has a dielectric constant greater than 10.

20. The memory configuration according to claim 2, wherein said memory dielectric has a dielectric constant greater than 10.

21. The memory configuration according to claim 1, wherein said memory dielectric is an oxidic dielectric.

22. The memory configuration according to claim 2, wherein said memory dielectric is an oxidic dielectric.

23. The memory configuration according to claim 1, wherein said memory dielectric is selected from the group consisting of PZT (Pb, Zr) $TiO_3$, BST (Ba, Sr) $TiO_3$, ST $SrTiO_3$ and SBTN $SrBi_2$, $(Ta_{1-x}, Nb_x)_2O_9$.

24. The memory configuration according to claim 2, wherein said memory dielectric is selected from the group consisting of PZT (Pb, Zr)$TiO_3$, BST (Ba, Sr)$TiO_3$, ST $SrTiO_3$ and SBTN $SrBi_2$, $(Ta_{1-x}, Nb_x)_2O_9$.

* * * * *